(12) United States Patent
Pace

(10) Patent No.: US 6,613,605 B2
(45) Date of Patent: Sep. 2, 2003

(54) INTERCONNECTION METHOD ENTAILING PROTUBERANCES FORMED BY MELTING METAL OVER CONTACT AREAS

(76) Inventor: Benedict G Pace, 2200 Smithtown Ave., Ronkonkoma, NY (US) 11779

( * ) Notice: Subject to any disclaimer, the term of this patent is extended or adjusted under 35 U.S.C. 154(b) by 0 days.

(21) Appl. No.: 09/737,408

(22) Filed: Dec. 15, 2000

(65) Prior Publication Data

US 2003/0124829 A1 Jul. 3, 2003

Related U.S. Application Data

(60) Provisional application No. 60/170,976, filed on Dec. 15, 1999, and provisional application No. 60/170,975, filed on Dec. 15, 1999.

(51) Int. Cl.[7] .............................................. H01L 21/44
(52) U.S. Cl. ....................................... 438/106; 438/125
(58) Field of Search ................................. 438/106, 125

(56) References Cited

U.S. PATENT DOCUMENTS

| | | | |
|---|---|---|---|
| 5,627,406 A | 5/1997 | Pace | |
| 5,793,105 A | 8/1998 | Pace | |
| 5,866,441 A | 2/1999 | Pace | |
| 5,904,499 A | 5/1999 | Pace | |
| 6,107,120 A * | 8/2000 | Ohtsuka | 438/106 |
| 6,165,820 A | 12/2000 | Pace | |
| 6,258,703 B1 * | 7/2001 | Cotte et al. | 438/612 |

OTHER PUBLICATIONS

Pace, U.S. Application No 09/737,407, filed Dec. 15, 2000 Title: "High Density Electronic Interconnection".
Pace, U.S. Application No. 09/745,966, filed Dec. 22, 2000 Title: "Inverted Chip Bonded Module".

* cited by examiner

Primary Examiner—Richard Elms
Assistant Examiner—Beth E. Owens
(74) Attorney, Agent, or Firm—John F. McCormack

(57) ABSTRACT

A method of forming bumped substrates with protuberances for inverted or flip-connection bonding of electronic devices including semiconductor devices, integrated circuits, and/or application specific integrated circuits and electromechanical devices. The substrates are high temperature insulating materials provided with a conductive pattern. The conductive pattern has contact areas corresponding to the input/output (I/O) pads of the electronic device. A metal is applied over the contact areas, and the temperature is raised above the melting point of the metal causing the metal to melt and draw back into a convex protuberance over the contact areas. The convex protuberances are suitable for connecting to the electronic devices by conductive adhesive bonding or metallurgically bonding such as thermocompression, thermosonic or ultrasonic bonding.

48 Claims, 1 Drawing Sheet

INTERCONNECTION METHOD ENTAILING PROTUBERANCES FORMED BY MELTING METAL OVER CONTACT AREAS

This application claims the benefit of Provisional Application No. 60/170,976 filed Dec. 15, 1999, and also of Provisional Application No. 60/170,975 filed Dec. 15, 1999.

FIELD OF THE INVENTION

The invention is related to methods of forming bumped substrates with protuberances for inverted or flip-connection bonding of electronic devices including semiconductor devices, integrated circuits, and/or application specific integrated circuits and electromechanical devices.

BACKGROUND OF THE INVENTION

Pace, in U.S. Pat. Nos. 5,627,406, 5,793105, 5,866,441, 5,904,499 and 6,165,820 has disclosed electronic packaging modules for inverted bonding of electronic devices, semiconductor devices, integrated circuits and application specific integrated circuits, and methods of making the modules. The modules are characterized by a substrate or base having a conductive pattern with soft, ductile, metal protuberances on the conductive pattern; and the protuberances being capable of being metallurgically bonded to the input/output pads of electronic devices. In the examples Pace describes an electroplating method of forming rounded gold protuberances. The plating conditions must be tightly controlled in order to prevent nodular deposits, or lateral growth of the gold deposits (i.e. short circuits between protuberances).

SUMMARY OF THE INVENTION

The present invention is an improved method of connecting to electronic devices by means of metal protuberances protruding from a supporting substrate. The improvement comprises forming the metal protuberances by depositing a metal on areas of the substrate that contain metallic sites; melting the metal into the shape of convex protuberances, and bonding the protuberances to said device.

In one embodiment it is a method for connecting to an electronic device by providing an insulating base with a conductive pattern and the conductive pattern has contact areas wettable by a molten metal. The metal is deposited over the contact areas, and then melted. The molten metal forms into protuberances on the contact areas. The device is then connected to the conductive pattern by bonding the protuberances to the device.

The present invention is an improved method of forming bumped substrates having metal protuberances suitable for bonding to the input/out pads (I/O's) of semiconductor, electronic and miniature electromechanical devices. The substrates have a conductive pattern. The conductive pattern includes basis metal pads which correspond to the I/O's of the devices. The method comprises applying a metal suitable both for supporting the devices and for bonding the I/O's of the devices to contact areas of the basis metal pads of the substrate and then melting the metal to form protuberances on the basis metal pads.

In one aspect the invention is an improvement in a method of manufacturing a package suitable for packaging at least one semiconductor device. The package comprises a ring frame bonded between an insulating substrate and a cover, the insulating substrate having a conductive pattern and the conductive pattern having both contact pads for connecting to the semiconductor device and connections suitable for connecting the package to another assembly. The semiconductor device is mounted on the inside of the cover and the input/out pads (I/O's) of the semiconductor device are joined to the contact pads of the substrate, by metal protuberances protruding from the contact pads of the substrate. The improvement in the method comprises forming the protuberances by applying a metal over the contact pads of the conductive pattern of the substrate and then raising the temperature of substrate above the melting point the metal; the molten metal drawing back into protuberances on the contact pads, and then cooling the substrate.

DETAILED DESCRIPTION OF THE INVENTION

Figure 1:
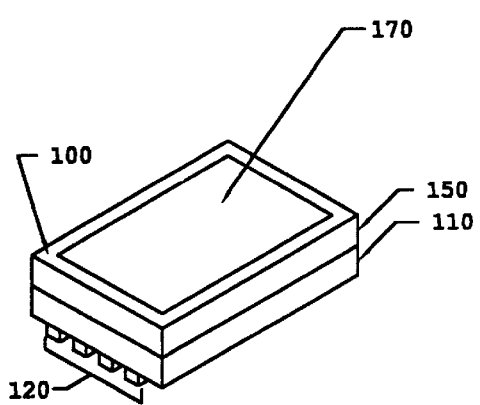
FIG. 1 illustrates an electronic packaging module that can be produced by the methods of this invention.

This invention relates to a methods of connecting and/or supporting electronic devices. It is an improved method of forming the metal bumps or protuberances on the surface of a substrate. The metal bumps or protuberances formed according to the method of this invention are capable of providing electrical connections and physical support for the electronic devices. Electronic devices include active and passive components, semiconductor dice and electromechanical devices. Electromechanical devices include relays, shutters, solenoids, accelerators, miniature electromechanical systems (MEMS) and the like. MEMS include, but are not limited to, micro flowmeters, miniature tuning forks, optical shutters, micropumps, miniature metering valves, miniature electromechanical relays, sensors, air-bag sensors and solenoids.

In the methods of this invention the surface of a substrate or base is provided with areas where the metal forming the bumps can be adhered when the metal is molten, and a background surface of the substrate where the molten metal is non-adherent. The areas can be metal pads or metallic sites capable of being wetted by the molten metal on a non-wettable background. The backgrounds include non-wettable metallic surfaces such as chrome or chrome alloys having a thin, non-wettable oxide layer, and non-wettable insulating surfaces and combinations of non-wettable surface background materials. Wettable areas are areas on the substrate surface where the molten metal adsorbs.

The bumps or protuberances are formed by applying metal to areas of the substrate and melting the metal to form the bumps or protuberances. The metal can be applied or deposited on the substrate by any suitable means such as plating, vacuum deposition, sputtering and the like, or as metal particles, wires, films or foils. The metal is applied to the desired area and also may be applied to contiguous background areas. The substrate is then heated to a temperature above the melting point of the metal, preferably in a vacuum, or an inert or reducing atmosphere. The surface tension of the molten metal draws it back from the contiguous background area forming a protuberance on the desired area. The height of the protuberance depends on the volume of metal applied on the desired area and also on contiguous background area. Preferably the metal that is applied on each desired area and the contiguous background area associated with it, is separated from neighboring areas and their contiguous metal deposits.

If the background surface is smooth, firm and non-wettable, the surface tension of the metal when molten will draw back any metal applied to the contiguous onto the desired area. The surface tension of the molten metal may not be sufficient to draw all the metal from the contiguous areas if the contiguous background is rough, textured, or if the surface of the background softens at the temperature of the molten metal. In such cases it is advisable to apply all of the metal required to form the protuberance directly on the desired area with little or no overlap of the contiguous background area.

One aspect of the invention comprises a method of forming connections for semi-conductors, electronic and electromechanical devices. The connecting means is an insulating substrate or base that has a conductive pattern. The conductive pattern forms the connection from the device to a package or a higher level assembly. The devices or semiconductor die or dice are joined to the conductive pattern by metal bumps or protuberances from the conductive pattern.

Flip-connecting a semiconductor chip to bumps or protuberances in a package by thermocompression, thermosonic or ultrasonic bonding, or other means have been described in U.S. Pat. No. 5,627,406, which is incorporated herein by reference.

The embodiment in FIG. 1, shows a compact, ceramic, chip carrier or single chip module (SCM), 100 with high packaging efficiency. The SCM has a conductive pattern on a ceramic substrate 110. The substrate has area array contacts 120 for interconnection to second level packaging and a metal or ceramic ring frame 150 around the semiconductor device or integrated circuit chip. The area array of contacts may be an irregular array or a regular array such as a ball, pin, pad or column array. Preferably the area array consists of convex metal bumps melted onto the contact pads of the ceramic substrate as described in the copending application entitled HIGH DENSITY ELECTRONIC INTERCONNECTION, Ser. No. 09/737,407, filed simultaneously with the current application. A metal or ceramic cover 170 is bonded to the frame to seal the module.

Figure 2:
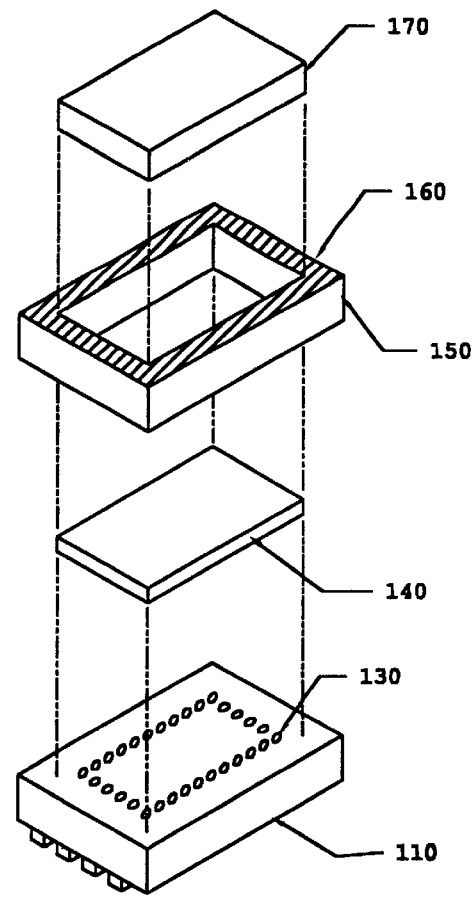
FIG. 2 is an exploded view of the packaging module.

In FIG. 2 the components of the module are shown. The conductive pattern of the substrate 110 has protuberances 130 of a soft, ductile metal. The soft, ductile metal of the protuberances is capable of being metallurgically bonded to the I/O's, input/output contacts, of a semiconductor device or integrated circuit chip. A semiconductor device 140 is positioned for bonding so that the I/O's face the protuberances on the conductive pattern. The I/O contacts of the device are joined to the soft, ductile, metal protuberances of the conductive pattern by soldering or thermocompression, ultrasonic or thermosonic bonding. The I/O contacts are then interconnected by the conductive pattern to the area grid array.

The frame of the module 150 fits closely around the integrated circuit die. For hermetically sealed modules, the frame is made of ceramic or metal and the frames are bonded to the substrate. A ceramic frame will preferably be metallized on its upper surface 160 for brazing to a metal cover.

The cover 170 is inside the frame, preferably making contact with the back of the electronic device or integrated circuit chip. When efficient removal of heat from the integrated circuit chip is required the cover or plug is preferably made of metal or a heat conductive ceramic. Also, the plug preferably is made of an material that matches the thermal expansion of the electronic device and the frame, such as a copper-tungsten, Kovar (an iron/nickel/cobalt alloy) or beryllia. The plug is soldered or bonded to the frame to seal the module.

The protuberances should be high enough to compensate for the variations due to camber, imperfect planarity and overall size of both the substrate and the device, and not so high that they collapse and short circuit in the process of bonding. The protuberances should form a secure bond to the conductive pattern and preferably be convex. With convex protuberances, rounded or tapered at the top, the tops can deform during the bonding to the device to compensate for the variations due to height of the devices and the camber and imperfect coplanarity of the substrate and/or the devices.

According to the present invention the metal bumps or protuberances for flip-connection of a semiconductor chip or other device to the substrate are formed of metals (1) capable of being bonded to the I/O's of the devices, and (2) having lower melting points than the basis metal comprising the conductive pattern of the insulating substrate.

Techniques for joining the protuberances to a device include adhesive and metallurgical bonding techniques. Adhesive bonding uses conductive organic materials and includes metal filled resins such as conductive epoxies, acrylics and polyimides. Metallurgical bonding techniques include welding, brazing, soldering, and the like. Welding techniques commonly used in the electronics industry include thermocompression bonding, ultrasonic bonding and thermal ultrasonic bonding.

Among the metals suitable for forming the protuberances are aluminum, copper, gold, indium, lead, silver, tin and alloys comprising these metals. The metallization on semiconductor chips is commonly aluminum, copper or gold. For most applications the preferred metal protuberances for ultrasonic, thermosonic or thermocompression bonding to the chips are formed of aluminum, copper, gold or alloys containing one of those metals.

The base for connecting to an electronic device is a conductive pattern on an insulating substrate. When the conductive pattern includes a conductive pattern layer on the top surface of the substrate the top conductive pattern layer is covered by a dielectric layer. Openings are provided through the dielectric layer to the conductive pattern layer. The openings correspond to the input/output pads (I/O's) of the device. The metal that will form the protuberances is applied in a pattern corresponding to the openings, and may overlap each opening in order to provide sufficient metal to form the protuberances. The substrate is then heated to a temperature above the melting point of the metal. The surface tension of the molten metal, much of which may be deposited overlapping the openings in the dielectric layer, causes the metal to draw back to the area of the conductive pattern exposed through the opening and form a bump there.

The base for the conductive pattern is formed from any insulating material that is stable at the fusing temperature of the metal forming the bumps. Suitable high temperature insulating materials include silicon, glass/ceramics ceramics and substrates comprising aluminum oxide, aluminum nitride, diamond, beryllium oxide, boron nitride, cordierite, mullite, silicon carbide and silicon nitride.

The conductive pattern can be formed by well known processes. The conductive pattern may be formed by thick film techniques, cofired ceramic techniques, thin film ceramic techniques, direct bond techniques or by metal plating.

A top surface conductive pattern layer may consist of discrete contact pads. The contact pads must be large enough to support the device and make efficient electrical connection to it. Contact pads for integrated circuits are typically 0.002–0.009 inch (0.05–0.23 mm) across. Power diodes, power transistors and electromechanical devices may require much larger contact areas for conductivity and/or physical support to support the device and/or make an efficient electrical connection.

Where the top surface conductive pattern includes conductor runs, a non-wettable layer is put over the conductors on the top surface of the base leaving only a wettable pad pattern exposed. The exposed wettable pads correspond to the I/O pads of the device. The non-wettable surface surrounds the wettable pads, and any conductor runs joined to the pads are not exposed to the metal forming the protuberances. When the molten metal coats a pad connected to an exposed conductor run, it is difficult to obtain uniform protuberances.

Metal is applied to the exposed wettable pads of the conductive pattern. When the metal applied over the conductive pattern is melted to form the protuberances, the surface tension of the molten metal draws the molten metal back and the molten metal coalesces over all the exposed contact pads of the conductive pattern. When the metal melts and draws back it forms rounded, convex protuberances against the contact pads.

Powdered metals or metal alloys may be applied to the substrate by incorporating the metal powder into a metallic paste, and printing the metallic pastes over the contact pads. Metallic pastes are applied using thick film screen printing techniques. The pastes are formulated with metal powders dispersed in organic vehicles. Typically, a gold paste is prepared by dispersing 90% by weight gold powder in an organic vehicle.

In one example the gold paste was printed over each of molybdenum conductor pads which were 0.008 inch (0.2 mm) in diameter. The gold paste prints were also 0.008 inch in diameter and did not overlap the conductor pads. The gold paste was dried at 120° C. Then the paste was reprinted three more times and dried after each printing to deposit a volume of gold to form sufficiently high bumps. The temperature was ramped up to about 450–550° C. to destroy the organic vehicle. The temperature was then raised to about 1100° C. The gold powder melted on the conductor pads forming rounded gold bumps 0.004 inch (0.1 mm) high. To prevent oxidation of the pads when melting the gold, the organic vehicle was decomposed and gold fused in a hydrogen reducing atmosphere, and the surface dielectric layer used to delineate the conductor pads was formulated as an alumina/borosilicate dielectric to avoid oxides that are reducible under these conditions.

Copper bumps on the conductive pattern of an insulating substrate also may be applied as a copper paste using thick film techniques. The organic vehicle is burned off and then the temperature is raised above the melting point of copper to melt the copper particles and form copper bumps on the metal pads. Alternatively, copper may be electroplated or electrolessly deposited on metal pads and even slightly overlap the dielectric surface surrounding the pads. Again the insulating substrate is heated above the melting point of copper in a reducing atmosphere to obtain copper bumps protruding from the pads.

The height of the protuberances is determined by the quantity of metal or alloy covering the pads or in an island that overlaps and surrounds the conductor pad. It would be obvious for one skilled in the art to select the thickness and diameter of the island over the conductor pad in order to obtain the bump height desired.

In one process for preparing an electronic package, an insulated gate bipolar transistor (IGBT) power chip, a diode chip and a resistor substrate are brazed to a gold plated molybdenum base called a "moly tab". The molybdenum base is 0.588 inch (15 mm) long and 0.408 inch (10.4 mm) wide. The power chip, diode and resistor substrate are selected to have the same thickness so that after brazing to the molybdenum base their heights above the moly tab do not vary more than 0.002 inch (0.05 mm).

A 96% alumina ceramic substrate is provided with through-holes. The holes are plugged with a metal to form conductive vias from the top to the bottom of the substrate. The plugged vias are terminated in metallic pads on the bottom of the insulating ceramic substrate. A conductive pattern is printed on the top of the ceramic substrate. The conductive pattern connects to the metallic pads on the bottom of the ceramic substrate by means of the conductive vias. On the top surface of the ceramic substrate, the conductive pattern terminates in areas to be electrically connected input/output pads of the IGBT, diode chip and the resistor substrate. A thick film dielectric layer is printed, dried and fired over the conductive pattern. The dielectric layer is printed with openings which leave exposed the input/output pad areas corresponding to the input/output connections of the IGBT, diode chip and the resistor substrate. The surface over the conductive pattern is made level by depositing a molybdenum/manganese paste into the openings in the dielectric, and then firing the substrate.

A gold paste is printed through a stencil on the top of the insulating substrate in a pattern which separately covers each interconnect pad. The print is first dried, and then the substrate is heated to 450° C. to decompose the organic vehicle and then to a temperature above the melting point of gold. The gold powder melts, and the surface tension draws the molten gold into bumps over the pad surfaces. The gold bumps formed are 0.004–0005 inch (0.10–0.12 mm) high.

A plated Kovar (iron/nickel/cobalt alloy) seal ring is brazed to the ceramic substrate. Then the moly tab with the IGBT and diode chips and the resistor substrate is positioned inside the ring frame and the gold bumps on the ceramic substrate are thermocompression bonded to the IGBT and diode chips and the resistor substrate that are on the moly tab. In the thermocompression bonding the 0.004–0.005 inch (0.10–0.12 mm) high, convex bumps easily adapt to the less than 0.002 inch (0.05 mm), height variation in the surfaces of the chips and resistor substrate. The Kovar seal ring is bonded to the moly tab to provide a hermetically sealed enclosure for the semiconductor chips. A Kovar lead frame is brazed to the metallic pads on the bottom of the alumina ceramic substrate to provide input/output connections from the package to a higher level assembly.

As an example of another process, a cofired ceramic substrate is provided that has a refractory metal (e.g., molybdenum/manganese) conductive pattern. The conductive pattern layer on the top surface of the ceramic substrate consists of refractory metal contact pads corresponding to the contact pads of an electronic device. The conductive pattern layer on the bottom surface of the ceramic substrate is a refractory metal pad grid array. The internal conductive pattern layer or layers connect the top surface contact pads to the bottom surface pad grid array.

A copper paste is printed on the bottom of the ceramic substrate in a pattern which separately covers (and overlaps) each refractory metal pad, and the printed paste is dried. A gold paste is printed on the top of the ceramic substrate over the refractory metal contact pads. The gold paste is dried and then the temperature ramped up to about 450–550° C. to decompose the organic vehicle of both the copper and gold pastes. The temperature is then raised above the melting points of copper and gold, and the part is fired at about 1100° C. The gold melts and the gold draws back to the contact pads forming convex gold protuberances suitable for thermocompression bonding to the input/output pads of a semiconductor device. Simultaneously the copper melts and draws back to the grid array pads, forming rounded copper bumps.

The copper bumps formed on the bottom of each conductive via are suitable for connecting the package to another assembly (e.g., a printed wiring board) by soldering. This method for providing packages with solderable, bumped, grid arrays is more fully described in the copending application entitled HIGH DENSITY ELECTRONIC INTERCONNECTION. filed simultaneously with the current application, and which is incorporated herein by reference.

Following the formation of the gold and copper protuberances, a frame is sealed to the insulating substrate. The electronic device is mounted on a cover which will fit inside the frame. The semiconductor device is positioned inside the frame and the contact pads of the device are simultaneously thermocompression or thermosonically bonded to the gold protuberances. After sealing the cover to the frame, the package is complete. The package is then soldered to a printed wiring board by means of the copper bumps on the bottom of the package.

In one method of forming aluminum bumps, a contact pad pattern was printed on a 95% alumina, ceramic substrate with a thick film molybdenum/manganese paste. The ceramic substrate was fired at 1500° C. in a hydrogen atmosphere to provide metallic molybdenum pads suitable for interconnecting an electronic device. An aluminum wire which was 99.99% pure aluminum was lightly etched in 1% sodium hydroxide solution, washed in distilled water and dried. The ceramic substrate was placed in a vacuum chamber with short pieces of the aluminum wire on the metallic pads. The vacuum was maintained between $1 \times 10^{-8}$ and $5 \times 10^{-8}$ Torr, and the ceramic substrate was heated to 600° C. The outgassing of the vacuum chamber and its contents was monitored with a mass spectrophotometer. When the outgassing subsided, the temperature of the ceramic substrate was raised to about 700° C., held at that temperature for two minutes and then cooled. After cooling the metallic pads had convex aluminum bumps, suitable for ultrasonic bonding to interconnecting electronic devices.

In another method of forming aluminum bumps suitable for flip-connection bonding, aluminum is evaporated on to an insulating substrate that has a conductive pattern with exposed metal pads. The aluminum is evaporated through a mask. The mask permits deposition of aluminum in a pattern that covers each pad separately. After the aluminum is deposited the substrate is heated to a temperature above the melting point of aluminum. The aluminum melts and draws back into convex bumps covering each pad. The aluminum bumps should be high enough for easy bonding to a device. Insufficient aluminum on molybdenum contact pads will not give high bumps. In such a case one must increase either the area of the evaporated aluminum in contact with the metal contact pad, or the thickness of the evaporated aluminum layer, in order to obtain the proper aluminum bumps.

It will be obvious to those skilled in the art that the metal protuberances may be used to connect to more than one electronic device, semiconductor chip, or multiple semiconductor circuits on a single die, wafer or section of a wafer.

I claim:

1. In a method of forming metal protuberances capable of being connected to at least one electronic device, the protuberances being formed on a conductive pattern of an insulating substrate, an improvement comprising:

forming the metal protuberances by depositing metal on areas of the insulating substrate that contain metallic sites, the metal being deposited on areas that include the metallic sites and contiguous areas, and melting the metal, whereupon melting, the metal draws back from the contiguous areas onto the metallic sites into shapes of convex metal protuberances, the protuberances being capable of being bonded to the electronic device.

2. In the method according to claim 1, wherein the metal being melted to form metal protuberances is capable of being metallurgically bonded to the electronic device.

3. In the method according to claim 1, wherein the metal being melted to form metal protuberances is capable of being adhesively bonded to the electronic device with an organic adhesive.

4. In the method according to claim 1, wherein the metal protuberances are formed of metals selected from a group consisting of aluminum, copper, gold, indium, lead, silver, tin and alloys comprising these metals.

5. In the method according to claim 2, wherein the metal protuberances comprise aluminum.

6. In the method according to claim 2, wherein the metal protuberances comprise a metal selected from a group consisting of copper, gold and alloys comprising these metals.

7. In the method according to claim 4, wherein the metals are deposited by a means selected from a group consisting of plating, vacuum deposition, sputtering, depositing powdered metal, electroplating and electroless deposition.

8. In the method according to claim 7, wherein the powdered metal is deposited by screen printing a metal paste over the metallic sites.

9. A method for making a connection to contacts of an electronic device comprising:

providing an insulating base having a conductive pattern, the conductive pattern having contact areas wettable by a molten metal;

depositing metal over the contact areas of the insulating base, the metal being deposited over the wettable contact areas including some metal deposited on non-wettable areas contiguous to the wettable area, and melting the metal, the molten metal drawing back from the non-wettable areas to the wettable contact areas forming metal protuberances on the contact areas of the insulating base, the metal protuberances being capable of being bonded to the contacts of the device.

10. In the method according to claim 9, wherein the metal being melted to form protuberances is capable of being metallurgically bonded to the electronic device.

11. In the method according to claim 10, wherein the protuberances are welded to the contacts of the electronic device.

12. In the method according to claim 9, wherein the metal being melted to form protuberances is capable of being adhesively bonded to the electronic device with an organic adhesive.

13. In the method according to claim 9, wherein the protuberances are formed of a metal selected from a group consisting of aluminum, copper, gold, indium, lead, silver, tin and alloys comprising these metals.

14. In the method according to claim 13, wherein the protuberances comprise a metal selected from a group consisting of copper, gold and alloys comprising these metals.

15. In the method according to claim 13, wherein the metal forming the metal protuberances is deposited by a means selected from a group consisting of plating, vacuum deposition, sputtering, depositing powdered metal, electroplating and electroless deposition.

16. In the method according to claim 15, wherein the powdered metal is deposited by screen printing a metal paste over the contact areas.

17. In the method of manufacturing a package suitable for packaging at least one electronic device, the package comprising a ring frame which is bonded to a cover and to an insulating substrate having a conductive pattern, the conductive pattern having contact pads for connecting to the electronic device and connections suitable for connecting the package to an another assembly; the electronic device being mounted on an inside of the cover and input/out pads (I/O's) of the electronic device being joined to the conductive pattern of the insulating substrate by first metal protuberances protruding from the contact pads of the conductive pattern; an improvement in the method comprising forming the first metal protuberances by applying a first metal over the contact pads of the conductive pattern of the insulating substrate and then melting the first metal, the molten first metal drawing back to form first convex metal protuberances on the contact pads, and then cooling the first metal.

18. In the method of claim 17, wherein the insulating substrate is a ceramic having a conductive pattern, the improvement comprising forming the first metal protuberances of a metal selected from a group consisting of aluminum, copper, gold, indium, lead, silver, tin and alloys comprising these metals.

19. In a method according to claim 18, wherein the first metal is selected from a group consisting of copper, gold and alloys comprising these metals.

20. In the method according to claim 18, wherein the first metal is applied to the contact pads of the conductive pattern by a means selected from a group consisting of plating, vacuum deposition, sputtering, depositing powdered metal, electroplating and electroless deposition.

21. In a method according to claim 20, wherein the powdered metal is deposited by screen printing a metal paste on the contact pads.

22. In the method of claim 17, second wherein the connections suitable to connecting the package to another assembly also comprise second metallic sites of the conductive pattern external to the package, a further improvement comprising applying a second metal to said second metallic sites, melting the second metal, and forming second metal protuberances on the second metallic sites.

23. The method of claim 22, wherein the metal selected as the second metal is also the metal selected as the first metal.

24. The method of claim 22, wherein the first metal is selected from a group consisting of gold and copper and alloys comprising these metals.

25. The method of claim 24, wherein the second metal is selected from a group consisting of copper and copper alloys.

26. In a method for producing a package for an electronic device, the package having as its base an insulating substrate, the base having metal protuberances on a first surface and a contact pad array on a second surface, the metal protuberances and contact pad array being connected to and part of a conductive pattern of the base, the metal protuberances being suitable for flip-connection mounting of one or more electronic components onto the base, an improved method comprising:

depositing a first metal suitable for flip-connection bonding to electronic components on the first surface of the base;

depositing a second metal suitable for forming connections on the contact pad array on the second surface of the base, and heating the first and second metals above their melting points wherein the molten metal draws back forming metal protuberances suitable for flip-connection bonding on the first surface, and metal bumps suitable for connection to another package on the second surface.

27. In the method of claim 26, wherein the first metal deposited on the first surface is selected from a group consisting of aluminum, gold, indium, lead, silver, tin and alloys comprising those metals.

28. In the method of claim 27, wherein the first metal deposited on the first surface is selected from a group consisting of aluminum, copper, gold and alloys comprising those metals.

29. In the method according to claim 26, wherein the first and second metals are applied to the contact pads of the conductive pattern by a means selected from a group consisting of plating, vacuum deposition, sputtering, depositing powdered metal, electroplating and electroless deposition.

30. In a method of manufacturing a circuit module as a package for at least one electronic device, the module comprising an insulating substrate having a conductive pattern with contact pads corresponding to the pads of the electronic device, and metal contacts, suitable for connecting the module to an another module or the next level electronic assembly, an improvement comprising:

applying a first metal to contact pads of the conductive pattern which correspond to the pads of the electronic device;

applying a second metal to the metal contacts of the conductive pattern suitable for connecting to another module or electronic package;

raising the temperature of the first and second metals above their melting points, melting the metals, the molten metals drawing back, and then cooling the metals, the first metal forming convex protuberances suitable for forming metallurgical bonds to the pads of the electronic device, and the second metal forming convex protuberances suitable for connecting the module to another module or next level electronic assembly.

31. The method of claim 30, wherein the metal used as the second metal is also the metal used as the first metal.

32. A process for preparing an electronic package comprising:

providing an insulating substrate having a conductive pattern, the conductive pattern having exposed pads which correspond to the pads of the at least one electronic device;

depositing a metal paste on the insulating substrate in a pattern separately covering each pad of the conductive pattern;

raising the temperature of the insulating substrate above the melting point of the metal of the metal paste wherein the molten metal draws back; cooling the insulating substrate, forming convex metal protuberances suitable for bonding to the input/output pads of the at least one electronic device, and metallurgically bonding the convex metal protuberances to the pads of the at least one electronic device.

33. The process of claim 32, wherein the insulating substrate is provided having a conductive pattern of refractory metal.

34. The process of claim 32, wherein the insulating substrate has a dielectric coating on the conductive pattern, the dielectric coating having openings to the conductive pattern, the openings corresponding to the pads of the at least one electronic device.

35. The process of claim 34, wherein prior to depositing the metal, the surface over the conductive pattern is made level by depositing a paste containing a refractory metal into the openings in the dielectric layer and then firing the substrate.

36. The process of claim 35, wherein the metal forming the convex, metal protuberances is is applied to pads of the conductive pattern using thick film screen printing techniques.

37. The process of claim 36, wherein the metal deposited by thick film screen printing techniques is selected from a group consisting of copper, gold and alloys comprising these metals.

38. The process of claim 36, wherein the metal is applied over the pads in a plurality of thick film screen prints.

39. In a method of forming metal protuberances capable of being connected to at least one electronic device, the metal protuberances being formed on a conductive pattern of an insulating substrate, the improvement comprising:

forming metal protuberances by depositing metal on areas of the substrate that contain metallic sites; melting the metal wherein the molten metal draws back, and cooling the metal into convex, metal protuberances on the sites, the metal protuberances being capable of being bonded to the device, and the metal of the protuberances being selected from a group consisting of aluminum, copper, gold and alloys comprising these metals.

40. In the method according to claim 39, wherein the metal being melted to form metal protuberances is capable of being metallurgically bonded to the electronic device.

41. In the method according to claim 39, wherein the metal being melted to form metal protuberances is capable of being adhesively bonded to the device with an organic adhesive.

42. The method according to claim 40, further comprising metallurgically bonding the metal protuberances to the electronic device.

43. In a method for making a connection to contacts of an electronic device comprising:

providing an insulating base having a conductive pattern, the conductive pattern having contact areas wettable by a molten metal;

depositing metal over the contact areas, the metal being selected from a group consisting of aluminum, copper, gold and alloys comprising these metals, and melting the metal wherein the molten metal draws back, and cooling the metal into convex, metal protuberances on the contact areas, the metal protuberances being capable being bonded to the contacts of the device.

44. In the method according to claim 43, wherein the metal protuberances are capable of being metallurgically bonded to the device.

45. In the method according to claim 44, wherein the metal protuberances are welded to the contacts of the device.

46. In the method according to claim 43, wherein the metal protuberances are capable of being adhesively bonded to the device with an organic adhesive.

47. In the method according to claim 43, wherein the metals are deposited by a means selected from a group consisting of plating, vacuum deposition, sputtering, depositing powdered metal, electroplating and electroless deposition.

48. In the method according to claim 47, wherein the powdered metal is deposited over the contact areas by thick film printing a metal paste over the contact areas.

* * * * *